United States Patent
Subramani et al.

(10) Patent No.: US 10,577,689 B2
(45) Date of Patent: Mar. 3, 2020

(54) SPUTTERING SHOWERHEAD

(71) Applicant: Applied Materials, Inc., Santa Clara, CA (US)

(72) Inventors: Anantha K. Subramani, San Jose, CA (US); Tza-Jing Gung, San Jose, CA (US); Praburam Gopalraja, San Jose, CA (US); Hari K. Ponnekanti, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 79 days.

(21) Appl. No.: 15/704,850

(22) Filed: Sep. 14, 2017

(65) Prior Publication Data
US 2018/0087155 A1   Mar. 29, 2018

Related U.S. Application Data

(60) Provisional application No. 62/399,030, filed on Sep. 23, 2016.

(51) Int. Cl.
*C23C 14/35* (2006.01)
*C23C 16/455* (2006.01)
*C23C 28/00* (2006.01)
*H01J 37/32* (2006.01)
(Continued)

(52) U.S. Cl.
CPC .... *C23C 16/45565* (2013.01); *C23C 14/3407* (2013.01); *C23C 14/3435* (2013.01);
(Continued)

(58) Field of Classification Search
CPC . C23C 14/3407; C23C 14/3435; C23C 14/35; C23C 16/45565; C23C 16/50;
(Continued)

(56) References Cited

U.S. PATENT DOCUMENTS 6,123,775 A    9/2000  Hao et al.
6,596,133 B1   7/2003  Moslehi et al.
(Continued)

FOREIGN PATENT DOCUMENTS

EP    0 808 915    *  5/1997
JP    10-064850    *  3/1998
(Continued)

OTHER PUBLICATIONS

Machine Translation of JP 10-064850 dated Mar. 1998. (Year: 1998).*

(Continued)

*Primary Examiner* — Rodney G Mcdonald
(74) *Attorney, Agent, or Firm* — Patterson + Sheridan LLP

(57) ABSTRACT

In one implementation, a sputtering showerhead assembly is provided. The sputtering showerhead assembly comprises a faceplate comprising a sputtering surface comprising a target material and a second surface opposing the sputtering surface, wherein a plurality of gas passages extend from the sputtering surface to the second surface. The sputtering showerhead assembly comprises further comprises a backing plate positioned adjacent to the second surface of the faceplate. The backing plate comprises a first surface and a second surface opposing the first surface. The sputtering showerhead assembly has a plenum defined by the first surface of the backing plate and the second surface of the faceplate. The sputtering showerhead assembly comprises further comprises one or more magnetrons positioned along the second surface of the backing plate.

20 Claims, 3 Drawing Sheets

(51) Int. Cl.
*C23C 16/50* (2006.01)
*H01J 37/34* (2006.01)
*C23C 14/34* (2006.01)
*C23C 28/02* (2006.01)
*C23C 28/04* (2006.01)

(52) U.S. Cl.
CPC .............. *C23C 14/35* (2013.01); *C23C 16/50* (2013.01); *C23C 28/021* (2013.01); *C23C 28/023* (2013.01); *C23C 28/042* (2013.01); *C23C 28/32* (2013.01); *C23C 28/345* (2013.01); *C23C 28/42* (2013.01); *H01J 37/3244* (2013.01); *H01J 37/3405* (2013.01); *H01J 37/3417* (2013.01); *H01J 37/3426* (2013.01)

(58) Field of Classification Search
CPC ... C23C 28/021; C23C 28/023; C23C 28/042; C23C 28/32; C23C 28/345; C23C 28/42; H01J 37/3244; H01J 37/3405; H01J 37/3417; H01J 37/3426
USPC ............. 204/298.07, 298.11, 192.12, 192.15
See application file for complete search history.

(56) References Cited

U.S. PATENT DOCUMENTS

| | | | |
|---|---|---|---|
| 6,983,892 B2 | 1/2006 | Noorbakhsh et al. | |
| 7,104,217 B2* | 9/2006 | Himori | H01J 37/32082 118/723 E |
| 7,601,246 B2 | 10/2009 | Kim et al. | |
| 8,361,549 B2 | 1/2013 | Yim et al. | |
| 2004/0060817 A1* | 4/2004 | Clarke | C23C 14/228 204/298.07 |
| 2005/0183827 A1 | 8/2005 | White et al. | |
| 2009/0272647 A1 | 11/2009 | Young et al. | |
| 2010/0252417 A1 | 10/2010 | Allen et al. | |
| 2011/0265721 A1 | 11/2011 | Kao et al. | |
| 2014/0017897 A1 | 1/2014 | Seamons et al. | |
| 2014/0216344 A1 | 8/2014 | Kudela et al. | |
| 2015/0279635 A1 | 10/2015 | Subramani et al. | |

FOREIGN PATENT DOCUMENTS

| | | |
|---|---|---|
| KR | 10-2011-0105308 | 9/2011 |
| KR | 10-1179453 B1 | 9/2012 |

OTHER PUBLICATIONS

International Search Report and Written Opinion for International Application No. PCT/US2017/051614 dated Dec. 26, 2017.
Office Action for Taiwan Application No. 106132596 dated Jun. 19, 2019.
Search Report for Taiwan Application No. 106132596 dated Jun. 3, 2019.

* cited by examiner

SPUTTERING SHOWERHEAD

CROSS-REFERENCE TO RELATED APPLICATIONS

This application claims benefit of U.S. Provisional Patent Application Ser. No. 62/399,030, filed Sep. 23, 2016, which is incorporated herein by reference in its entirety.

BACKGROUND

Field

Implementations described herein generally relate to an apparatus and a method for depositing materials, and more particularly to a vapor deposition chamber having a sputtering showerhead capable of both physical vapor deposition and chemical vapor deposition.

Description of the Related Art

In the fabrication of integrated circuits, deposition processes such as chemical vapor deposition (CVD) or physical vapor deposition (PVD) are used to deposit films of various materials upon semiconductor substrates. These deposition processes often occur in separate enclosed process chambers.

Process gases are used to deposit films on the substrate in a CVD chamber. The process gases may be supplied to a substrate positioned on a substrate support. A purge gas may be provided to remove process gases. The process gas and the purge gas may be removed from the process chamber using a common exhaust disposed away from the process area, such as around an outer perimeter of the process chamber, to prevent mixing of the purge gas with the process gas in the process area.

A PVD process includes sputtering a target comprising a source material with ions generated in a plasma region, causing ejected source material to travel to a substrate. The ejected source material may be accelerated towards the substrate via a negative voltage or bias formed on the substrate. Some PVD process chambers provide RF energy to a target to increase uniformity.

The two process chambers employ very different process conditions for deposition. CVD processes operate at much higher temperatures than PVD processes and involve the use of specialized precursors. In order to deposit multiple layers of oxide and metal onto a substrate, the substrate is transferred from one chamber to the next and then back again. Using the arrangement described above, contaminants and other impurities may deposit on the substrate during transition from one system to the next, especially when trying to deposit alternating layers of oxide and metal, causing non-uniformity in the semiconductor film.

Thus, there is a need for an improved system and method for depositing an oxide and a metal on a substrate.

SUMMARY

Implementations described herein generally relate to an apparatus and a method for depositing materials, and more particularly to a vapor deposition chamber having a sputtering showerhead capable of both physical vapor deposition and chemical vapor deposition. In one implementation, a sputtering showerhead assembly is provided. The sputtering showerhead assembly comprises a faceplate comprising a sputtering surface comprising a target material and a second surface opposing the sputtering surface, wherein a plurality of gas passages extend from the sputtering surface to the second surface. The sputtering showerhead assembly comprises further comprises a backing plate positioned adjacent to the second surface of the faceplate. The backing plate comprises a first surface and a second surface opposing the first surface. The sputtering showerhead assembly has a plenum defined by the first surface of the backing plate and the second surface of the faceplate. The sputtering showerhead assembly comprises further comprises one or more magnetrons positioned along the second surface of the backing plate.

In another implementation, a deposition chamber is provided. The deposition chamber comprises a sputtering showerhead assembly and a substrate support disposed below the sputtering showerhead assembly. The sputtering showerhead assembly comprises a faceplate comprising a sputtering surface comprising a target material and a second surface opposing the sputtering surface, wherein a plurality of gas passages extend from the sputtering surface to the second surface. The sputtering showerhead assembly comprises further comprises a backing plate positioned adjacent to the second surface of the faceplate. The backing plate comprises a first surface and a second surface opposing the first surface. The sputtering showerhead assembly has a plenum defined by the first surface of the backing plate and the second surface of the faceplate. The sputtering showerhead assembly comprises further comprises one or more magnetrons positioned along the second surface of the backing plate.

In yet another implementation, a method of deposition is provided. The method comprises positioning a substrate on a substrate support and flowing a precursor fluid through the faceplate of a sputtering showerhead assembly into an interior volume to deposit a first layer on the substrate. The interior volume is disposed between the sputtering showerhead assembly and the substrate support. The method further comprises sputtering one or more metals from the faceplate of the sputtering showerhead assembly to deposit a second layer on the first layer.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes a sputtering showerhead that performs both physical vapor deposition (PVD) and chemical vapor deposition (CVD) processes and a processing chamber incorporating the sputtering showerhead. Certain details are set forth in the following description and in FIGS. 1-4 provide a thorough understanding of various implementations of the disclosure. Other details describing well-known structures and systems often associated with PVD and CVD are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Figure 1:
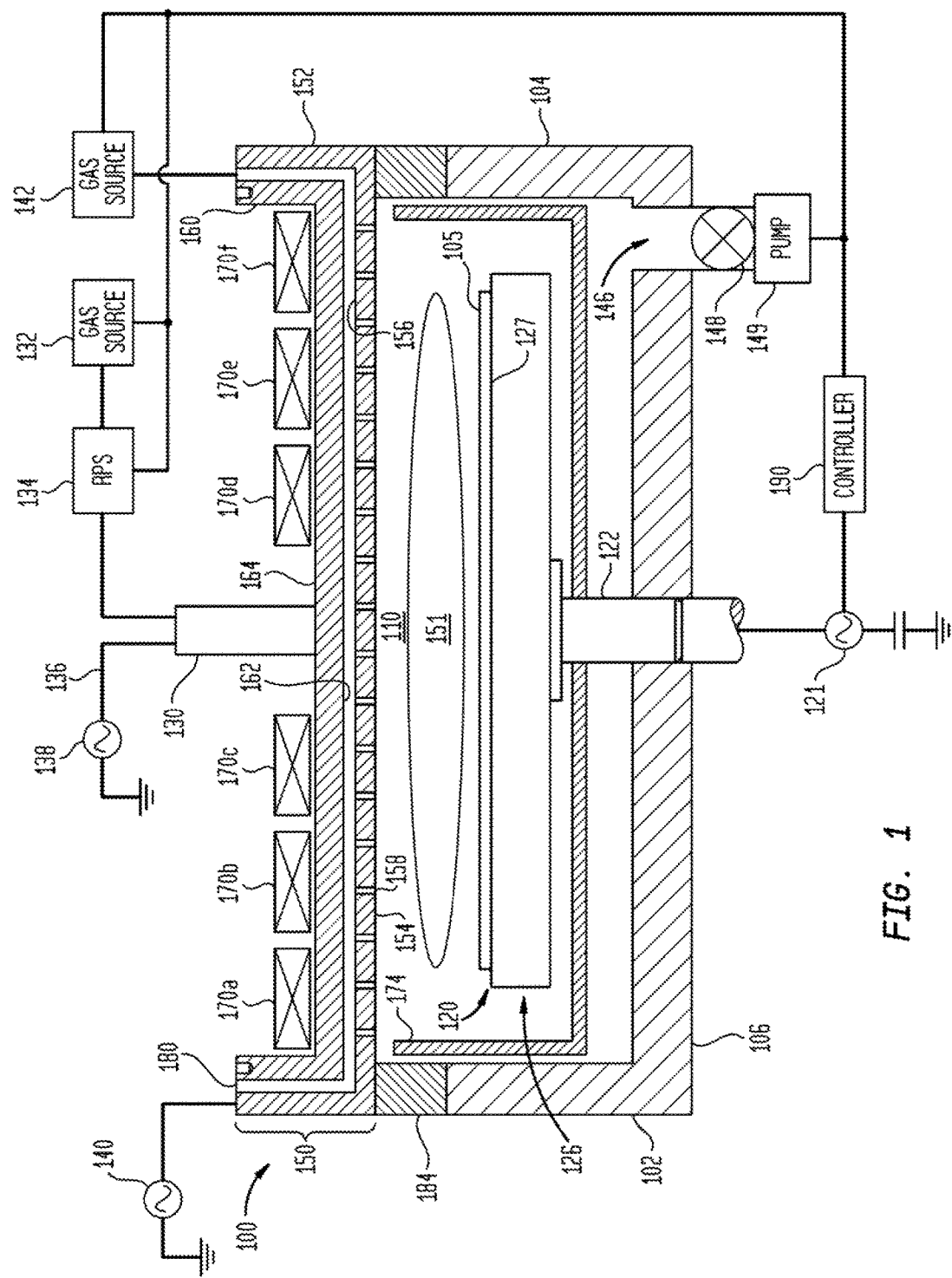
FIG. 1 depicts a sectional, partially schematic side view of a plasma chamber that includes a sputtering showerhead assembly according to implementations described herein.
Figure 2:
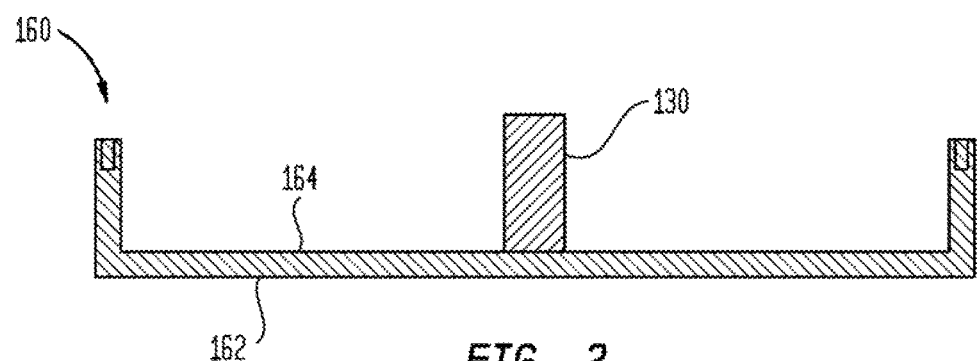
FIG. 2 depicts a schematic side view of a backing plate of the sputtering showerhead assembly according to implementations described herein.
Figure 3A:
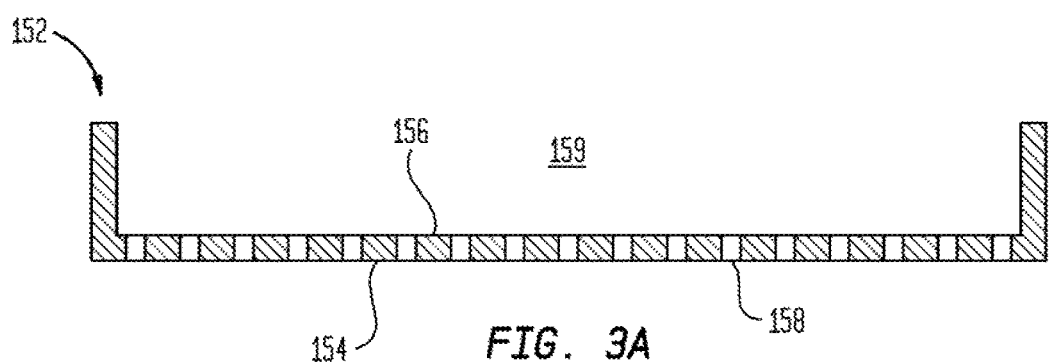
FIG. 3A depicts a schematic side view of a faceplate of the sputtering showerhead assembly according to implementations described herein.
Figure 3B:
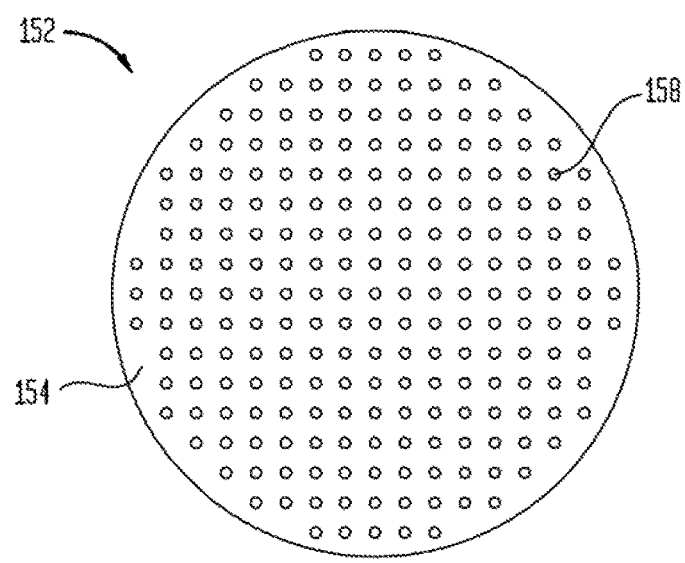
FIG. 3B depicts a top view of the faceplate of FIG. 3A.

FIG. 1 is a sectional, partially schematic side view of an exemplary plasma-processing chamber 100 that includes one implementation of a sputtering showerhead assembly 150 capable of processing a substrate 105 according to implementations described herein. FIG. 2 is a schematic side view of a backing plate 160 of the sputtering showerhead assembly 150 according to implementations described herein. FIG. 3A is a schematic side view of a faceplate 152 of the sputtering showerhead assembly 150 according to implementations described herein. FIG. 3B is a top view of the faceplate 152 of FIG. 3A.

The sputtering showerhead assembly 150 includes a faceplate that includes a plurality of gas delivery passages and functions as a sputtering target. The plasma-processing chamber 100 functions as both a physical vapor deposition (PVD) chamber capable of depositing metals or metal oxides on a substrate and a chemical vapor deposition (CVD) chamber capable of depositing dielectric materials on the substrate. The plasma-processing chamber 100 may also be used for other purposes, such as for example, to deposit oxides, nitrides, aluminum, copper, tantalum, tantalum nitride, tantalum carbide, tungsten, tungsten nitride and titanium.

The plasma-processing chamber 100 includes a chamber body 102 having sidewalls 104, a bottom wall 106 and the sputtering showerhead assembly 150 that enclose an interior volume 110 or plasma zone. The chamber body 102 is typically fabricated from welded plates of stainless steel or a unitary block of aluminum. In one implementation, the sidewalls 104 comprise aluminum and the bottom wall 106 comprises stainless steel. The sidewalls 104 generally contain a slit valve (not shown in this view) to provide entry and egress of the substrate 105 from the plasma-processing chamber 100. The sputtering showerhead assembly 150 of the plasma-processing chamber 100 in conjunction with a movable shield confines a plasma formed in the interior volume 110 to the region above the substrate 105.

A pedestal assembly 120 is supported from the bottom wall 106 of the plasma-processing chamber 100. The pedestal assembly 120 supports the substrate 105 during processing. The pedestal assembly 120 is coupled to the bottom wall 106 of the plasma-processing chamber 100 by a lift mechanism 122 that is configured to move the pedestal assembly 120 between an upper position and a lower position. Additionally, in the lower position, lift pins are moved through the pedestal assembly 120 to space the substrate 105 from the pedestal assembly 120 to facilitate exchange of the substrate with a wafer transfer mechanism disposed exterior to the plasma-processing chamber 100, such as a single blade robot (not shown). Optionally, a bellows (not shown) is typically disposed between the pedestal assembly 120 and the bottom wall 106 to isolate the interior volume 110 of the chamber body 102 from the interior of the pedestal assembly 120 and the exterior of the chamber.

The pedestal assembly 120 generally includes a substrate support 126. The substrate support 126 may be comprised of aluminum or ceramic. The substrate support 126 has a substrate-receiving surface 127 that receives and supports the substrate 105 during processing; the substrate-receiving surface 127 defines a plane parallel or substantially parallel to a sputtering surface 154 of the faceplate 152. The substrate support 126 may be an electrostatic chuck, a ceramic body, a heater or a combination thereof. In one implementation, the substrate support 126 is an electrostatic chuck that includes a dielectric body having a conductive layer embedded therein. The dielectric body is typically fabricated from a high thermal conductivity dielectric material such as pyrolytic boron nitride, aluminum nitride, silicon nitride, alumina or an equivalent material. In one implementation, the substrate support 126 functions as a bottom electrode that is biased by an RF power source 121 (typically via a matching network). In one implementation, the substrate support is rotatable.

The sputtering showerhead assembly 150 generally includes the faceplate 152, the backing plate 160 opposite the faceplate 152, and one or more magnetrons 170a-170f (collectively 170). The one or more magnetrons 170a-170f may enhance uniformity and erosion control. The faceplate 152 and the backing plate 160 define a plenum 180.

The faceplate 152 comprises a first surface or sputtering surface 154 adjacent to the interior volume 110 and a second surface 156 or upper surface adjacent to the plenum 180 and opposing the sputtering surface. The faceplate 152 has a plurality of gas passages 158 extending from the second surface 156 to the sputtering surface 154. The plurality of gas passages 158 couples the interior volume 110 with the plenum 180 and provides a conduit for delivering processing gases from the plenum 180 to the interior volume 110. The plurality of gas passages 158 may also be used to deliver other gases such as carrier gases, purge gases, and/or cleaning gases to the interior volume 110. In one implementation, the plurality of gas passages 158 are evenly distributed across a surface area of the faceplate 152 corresponding to a surface area of the substrate support 126. Gas introduced into the plenum 180 may be evenly dispersed behind the faceplate 152 for introduction into the interior volume 110 through the plurality of gas passages 158.

In one implementation, gas may be introduced into the plenum 180 through a gas input 130. The gas may be provided by a gas source 132. In one implementation, the gas source 132 may comprise a processing gas source. In another implementation, the gas source 132 may comprise a cleaning gas source. The gas may travel from the gas source 132 through a remote plasma source 134. An RF power source 138 may also be coupled with the gas input 130 by an RF feed 136. In some implementations, a DC power source is coupled with the gas input 130 by a DC feed.

In one implementation, the faceplate 152 is formed from a target material. The faceplate 152 provides material, which is deposited on the substrate 105 during the deposition process. Exemplary target materials that may be used to form the faceplate 152 include, but are not limited to, aluminum, steel, stainless steel (e.g., iron-chromium alloys optionally containing nickel), iron, nickel, chromium, aluminum, copper, tantalum, tantalum nitride, tantalum carbide, tungsten, tungsten nitride, titanium, an alloy thereof, and combinations thereof. In one implementation, the faceplate 152 is a planar disk.

The backing plate 160 comprises a first surface 162 or lower surface adjacent to the plenum 180 and a second surface 164 or upper surface opposing the first surface 162.

In one implementation, the backing plate 160 may be formed from a conductive material, such as metal or metal alloys. In one implementation, the backing plate 160 is formed from a metal. Exemplary metals may be selected from the group comprising or consisting of aluminum, steel, stainless steel (e.g., iron-chromium alloys optionally containing nickel), iron, nickel, chromium, an alloy thereof, and combinations thereof. In one implementation, the backing plate 160 is a planar disk.

In one implementation, an insulator (not shown) is positioned between the faceplate 152 and the backing plate 160. The insulator provides electrical insulation between the faceplate 152 and the backing plate 160. In one implementation, the insulator is formed from ceramic material, for example, aluminum nitride ($Al_xN_y$) or aluminum oxide ($Al_2O_3$).

In one implementation, the faceplate 152 has a recessed portion 159. As depicted in FIG. 1, the plenum 180 is defined by the recessed portion 159 and the first surface 162 of the backing plate 160. The plenum 180 is positioned above and fluidly coupled with the interior volume 110 via the plurality of gas passages 158 for supplying the processing gases to the interior volume 110.

One or more magnetrons 170a-170f (collectively 170) is coupled to a second surface 164 of the backing plate 160 on the exterior of the plasma-processing chamber 100. The one or more magnetrons 170 are positioned to control the erosion of the sputtering surface 154 of the faceplate 152. In one implementation, the one or more magnetrons 170 are positioned above the faceplate 152. The one or more magnetrons 170 may include one or more magnets supported by a base plate connected to a shaft, which may be axially aligned with a central axis of the faceplate 152. The magnets produce a magnetic field within the plasma-processing chamber 100 near the front face of the faceplate 152 to generate plasma, such that a significant flux of ions strike the faceplate 152 causing sputter emissions of the target material. The magnets may be rotated about the faceplate 152 to increase uniformity of the magnetic field across the sputtering surface 154 of the faceplate 152. The one or more magnetrons 170 are typically on during the PVD process but are typically off during the CVD process. It has been found by the inventors that the one or more magnetrons 170 significantly interfere with plasma, if used, during the CVD process.

The sputtering surface 154 of the faceplate 152 is exposed to the interior volume 110 of the plasma-processing chamber 100. The faceplate 152 provides material, which is deposited on the substrate during a PVD process. An isolator ring 184 is disposed between the faceplate 152 and chamber body 102 to electrically isolate the faceplate 152 and the chamber body 102.

The faceplate 152 is biased relative to ground, e.g., the chamber body 102 by an RF power source 140 (typically via a matching network). In another implementation, a gas, such as argon, is supplied to the interior volume 110 from a gas source 142 via the plenum 180 and the plurality of gas passages 158. The gas source 142 may comprise a non-reactive gas such as argon or xenon, which is capable of energetically impinging upon and sputtering the target material from the faceplate 152. The gas source 142 may also include a reactive gas, such as one or more of an oxygen-containing gas, a nitrogen-containing gas, and a methane-containing gas, that are capable of reacting with the sputtered target material to form a layer on a substrate. The gas source 142 may also include processing gases for depositing a film on the substrate 105 via a CVD process. Spent process gas and byproducts are exhausted from the plasma-processing chamber 100 through exhaust ports 146 that receive spent process gas and direct the spent process gas to an exhaust conduit 148 having a throttle valve to control the pressure of the gas in the plasma-processing chamber 100. The exhaust conduit 148 is connected to one or more exhaust pumps 149. Typically, the pressure of the sputtering gas in the plasma-processing chamber 100 is set to sub-atmospheric levels, such as a vacuum environment, for example, gas pressures of 0.6 mTorr to 400 mTorr. A plasma is formed between the substrate 105 and the faceplate 152 from the gas. Ions within the plasma are accelerated toward the faceplate 152 and cause material to become dislodged from the faceplate 152. The dislodged target material is deposited on the substrate 105.

In one implementation, the plasma-processing chamber 100 includes a movable liner 174 grounded within the chamber body 102. The movable liner 174 shields the interior volume 110 from the sidewalls 104 and isolator ring 184. The sidewalls 104 may be aluminum or stainless steel. The sidewalls 104 may react with precursors and cause contamination in the interior volume 110. The movable liner 174 may be moved down during higher pressure CVD processing and moved up toward the faceplate 152 to form dark space during low pressure PVD processing. During PVD processing, moving the movable liner 174 up toward the faceplate 152 reduces metallic deposition on the isolator ring 184. If unchecked, metallic deposition on the isolator ring 184 can lead to shorting between the metallic sidewalls 104 and the sputtering showerhead assembly 150. In one implementation, the movable liner 174 is coupled with the pedestal assembly 120 and moves up and down with the pedestal assembly 120. In another implementation, a separate lift mechanism is used to move the movable liner 174. The movable liner 174 may be fabricated from quartz or other process resistant material.

The plasma-processing chamber 100 is controlled by a controller 190 that comprises program code having instruction sets to operate components of the plasma-processing chamber 100 to process substrates in the plasma-processing chamber 100. For example, the controller 190 can comprise program code that includes a substrate positioning instruction set to operate the pedestal assembly 120; a gas flow control instruction set to operate gas flow control valves to set a flow of sputtering gas to the plasma-processing chamber 100; a gas pressure control instruction set to operate a throttle valve to maintain a pressure in the plasma-processing chamber 100; a temperature control instruction set to control a temperature control system (not shown) in the pedestal assembly 120 or sidewalls 104 to set temperatures of the substrate or sidewalls 104, respectively; and a process monitoring instruction set to monitor the process in the plasma-processing chamber 100.

Figure 4:
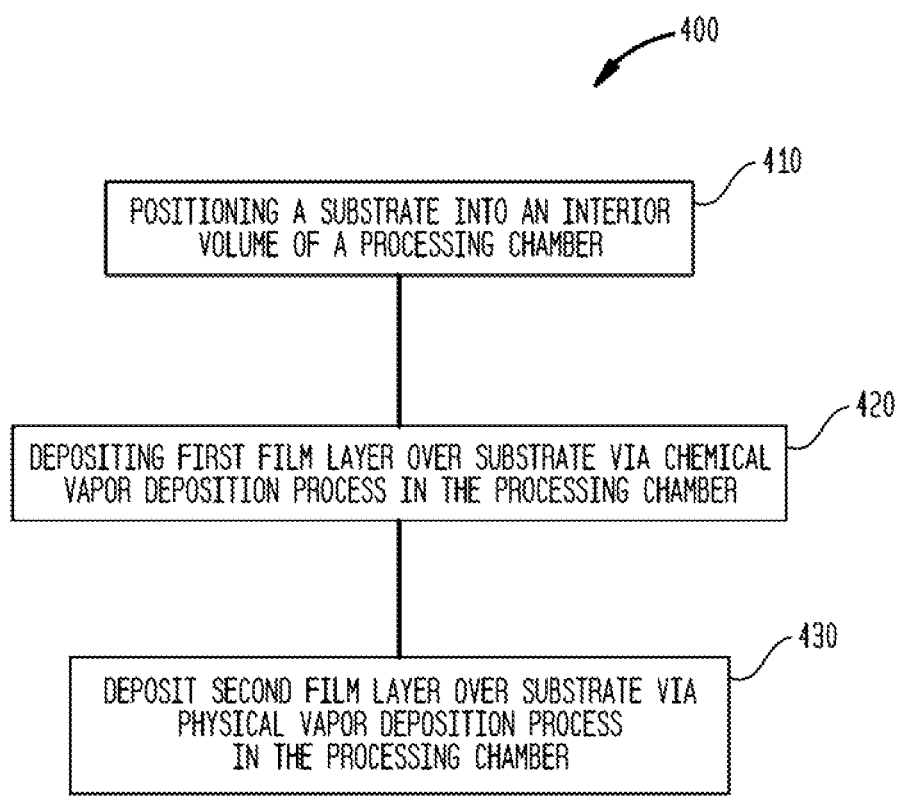
FIG. 4 depicts a process flow diagram of one implementation of a method for depositing material according to implementations described herein.

FIG. 4 depicts a process flow diagram of one implementation of a method 400 for depositing material according to implementations described herein. The method 400 begins at operation 410 by positioning a substrate (e.g., substrate 105) into a processing chamber, such as the plasma-processing chamber 100 depicted in FIG. 1. The substrate 105 is positioned on the substrate support 126. The substrate 105 may be electrically coupled to the substrate support 126 through an electric chuck (not shown). As described herein, the substrate support 126 is positioned opposite the sputtering showerhead assembly 150. The sputtering showerhead assembly 150 is disposed in the interior volume 110 of the plasma-processing chamber 100.

The substrate 105 may have a substantially planar surface, an uneven surface, or a structure formed thereon. In some implementations, one or more material layers are present on the substrate 105. In one implementation, the one or more material layers may be a part of a film stack utilized to form a gate structure, a contact structure, an interconnection structure or shallow trench isolation (STI) structure in the front end or back end processes for logic or memory devices, such as NAND structures. In implementations where the material layer is not present, the method 400 is performed directly on a surface of the substrate.

In one implementation, the material layer may be a film stack including repeating layers of silicon oxide and/or silicon nitride layers utilized to form a gate structure for NAND structures. Alternatively, the material layer may be a silicon material utilized to form a gate electrode. In yet another implementation, the material layer may include a silicon oxide layer, a silicon oxide layer deposited over a silicon layer. In yet another implementation, the material layer may include one or more layers of other dielectric materials utilized to fabricate semiconductor devices. Suitable examples of the dielectric layers include silicon oxide, silicon nitride, silicon oxynitride, silicon carbide, or any suitable low-k or porous dielectric material as needed. In still another implementation, the material layer does not include any metal layers.

At operation 420, a first layer is deposited over the substrate via a CVD process in the plasma-processing chamber 100. The CVD process may be a plasma-enhanced CVD process. The CVD process may be performed at higher pressures (e.g., about 10 Torr to about 20 Torr). In implementations where the movable liner 174 is present, the movable liner 174 is typically moved away from the faceplate 152 during the CVD process. The one or more magnetrons 170 are typically off during the CVD process of operation 420. The inventors have found that, if active, the one or more magnetrons 170 may interfere with plasma formed in the interior volume 110 during operation 420. The interior volume 110 is disposed between the sputtering showerhead assembly 150 and the substrate support 126.

In one implementation, the first layer is a dielectric layer. In one implementation, the first layer is a high-k dielectric layer. In one implementation, the first layer is an oxide-containing layer. In one implementation, the first film layer is a silicon oxide-containing layer, a silicon nitride-containing layer or a silicon-containing layer. In one implementation, the first layer is a silicon oxide layer.

A precursor fluid is flowed through the faceplate 152 of the sputtering showerhead assembly 150 into the interior volume 110. The precursor fluid may be one or more process gases that deposit a first layer on the substrate 105. In one implementation, the precursor fluid includes a silicon-containing gas and optionally a reacting gas. Suitable examples of the silicon-containing gas include, but are not limited to, silane ($SiH_4$), disilane ($Si_2H_6$), silicon tetrafluoride ($SiF_4$), silicon tetrachloride ($SiCl_4$), dichlorosilane ($SiH_2Cl_2$), tetraethyl orthosilicate (TEOS), and the like. The reacting gas may be an oxygen-containing gas, for forming a silicon oxide-containing layer, a nitrogen-containing gas, for forming a silicon nitride containing layer, or a carbon containing gas, for forming a silicon carbide containing layer. Suitable examples of the oxygen-containing gas include $O_2$, $N_2O$, $NO_2$, $O_3$, $H_2O$ and the like. Suitable examples of the nitrogen-containing gas include $N_2$, $N_2O$, $NO_2$, $NH_3$, $N_2H_2$, $NF_3$, and the like. Suitable examples of the carbon containing gas include $CO_2$, CO, $CH_4$, $CF_4$, other suitable carbon based polymer gases and the like. Alternatively, one or more inert gases may be included in the precursor fluid provided to the plasma-processing chamber 100. The inert gas may include, but not limited to, noble gas, such as Ar, He, and Xe, or $N_2$ and the like. In one implementation, the precursor fluid includes a halogen containing gas such as $NF_3$. In one implementation, the precursor fluid is flowed into the interior volume 110 for 5-25 seconds.

In one implementation described herein, the silicon-containing gas is TEOS, the reacting gas is an oxygen-containing gas such as $N_2O$ and the inert gas is argon to form the first film layer, such as a silicon oxide layer.

During operation 420, several process parameters are regulated while the precursor fluid is supplied into the processing chamber. In one implementation, a pressure of the precursor fluid in the processing chamber is regulated between about 10 mTorr to about 15 Torr, and the substrate temperature is maintained between about 200 degrees Celsius and about 700 degrees Celsius.

During operation 420, in one implementation, while supplying the precursor fluid into the processing chamber, an RF source power may be generated and coupled to the gas mixture to assist dissociating the precursor fluid into reactive species in a plasma, such as plasma 151. In some implementations, the RF source power may be generated prior to supplying the deposition gas into the process chamber.

After a desired thickness of the first film layer is achieved, the deposition process may then be terminated. Once deposition is complete, the area adjacent the interior volume 110 and the area below the substrate support 126 may be evacuated. In one implementation, a purge gas may be supplied to the interior volume 110. The purge gas may be oxygen, or an inert gas, such as nitrogen or argon. In some implementations where an inert gas is used during operation 420, the inert gas may be used as the purge gas with or without the application of RF power.

Optionally, prior to operation 430, the movable liner 174 may be moved upward to interface with the sputtering showerhead assembly 150 to define a plasma-forming region in the interior volume 110. The movable liner 174 may be moved up toward the faceplate 152 to form a dark space during the PVD process of operation 430. During PVD processing, moving the movable liner 174 up toward the faceplate 152 reduces metallic deposition on the isolator ring 184. If unchecked, metallic deposition on the isolator ring 184 can lead to shorting between the metallic sidewalls 104 and the sputtering showerhead assembly 150. In one implementation, the movable liner 174 is coupled with the pedestal assembly 120 and moves up and down with the pedestal assembly 120. In another implementation, a separate lift mechanism is used to move the movable liner 174.

At operation 430, a second layer is deposited over the substrate via a PVD process in the plasma-processing chamber 100. The second layer may be deposited on the first layer, if present. The second layer may be a metal-containing layer. The second layer may be a metal, metal oxide or metal alloy layer. During operation 430, one or more metals are sputtered from the faceplate of the sputtering showerhead assembly to deposit the second layer on the first layer. The second layer may be a metal, metal oxide or metal alloy.

Typically, the pressure of the sputtering gas in the plasma-processing chamber 100 is set to sub-atmospheric levels, such as a vacuum environment, for example, gas pressures of 0.6 mTorr to 400 mTorr. A plasma is formed between the substrate 105 and the faceplate 152 from the gas. Ions within the plasma are accelerated toward the faceplate 152 and cause target material to become dislodged from the faceplate 152. The dislodged target material is deposited on the substrate 105 to form the second layer. Any suitable target material may be used. In one implementation, the target material is selected from the group comprising or consisting of nickel, chromium, aluminum, copper, tantalum, tantalum nitride, tantalum carbide, tungsten, tungsten nitride, titanium, an alloy thereof, and combinations thereof.

Once sputtering is completed, the CVD process and PVD process may be repeated. The oxide layer and metal layer deposition may be repeated about 80 to 100 times such that 80 to 100 layers of alternating oxide and metal are deposited on the substrate 105.

The implementations disclosed herein relate to a single sputtering showerhead assembly capable of performing both CVD and PVD to reduce the cost of uniform semiconductor processing. Additionally, the single oxide metal deposition system reduces the time necessary for deposition on semiconductor substrates. Additionally, implementations provide the ability to sputter using RF energy to decrease damage on the substrate compared to traditional PVD processes. Implementations also provide the ability to use the benefits of high electron containment to control targeted erosion using magnets in a magnetron and DC power, and the more diffuse plasma (full-face erosion) created using an RF energy. It is contemplated that the implementations described herein may find suitable applicability in various integration schemes such as gate first and gate last integration schemes.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:

1. A deposition chamber, comprising:
 a chamber body;
 a sputtering showerhead assembly, comprising:
  a faceplate comprising a solid body, the solid body having:
   a sputtering surface comprising a target material;
   a second surface opposing the sputtering surface; and
   a plurality of gas passages extending through the solid body from the sputtering surface to the second surface of the faceplate, wherein the second surface of the faceplate defines a recessed portion;
  a solid backing plate positioned adjacent to the second surface of the faceplate and comprising:
   a first surface; and
   a second surface opposing the first surface, wherein a plenum is defined by the first surface of the solid backing plate and the recessed portion defined by the second surface of the faceplate, and the plenum is fluidly coupled with the plurality of gas passages; and
  one or more magnetrons positioned along and coupled to the second surface of the solid backing plate; and
 a substrate support disposed below the sputtering showerhead assembly, wherein the chamber body and the sputtering showerhead assembly define an interior volume.

2. The deposition chamber of claim 1, wherein the target material is selected from the group consisting of nickel, chromium, aluminum, copper, tantalum, tantalum nitride, tantalum carbide, tungsten, tungsten nitride, titanium, an alloy thereof, and combinations thereof.

3. The deposition chamber of claim 1, wherein the plurality of gas passages are evenly distributed across a surface area of the faceplate.

4. The deposition chamber of claim 1, wherein the faceplate is coupled with a first RF power source.

5. The deposition chamber of claim 4, wherein the substrate support is coupled with a second RF power source.

6. The deposition chamber of claim 1, further comprising a movable liner, wherein the movable liner interfaces with the sputtering showerhead assembly to define a plasma-forming region in the interior volume.

7. The deposition chamber of claim 1, wherein the plenum is positioned above the interior volume and fluidly coupled with the interior volume via the plurality of gas passages.

8. The deposition chamber of claim 1, wherein the faceplate further comprises a cylindrical wall, which extends from a perimeter of the faceplate, perpendicular to the second surface of the faceplate, and further defines the recessed portion.

9. A sputtering showerhead assembly, comprising:
 a faceplate comprising a solid body, the solid body having:
  a sputtering surface comprising a target material;
  a second surface opposing the sputtering surface; and
  a plurality of gas passages extending through the solid body from the sputtering surface to the second surface of the faceplate, wherein the second surface of the faceplate defines a recessed portion;
 a solid backing plate positioned adjacent to the second surface of the faceplate and comprising:
  a first surface; and
  a second surface opposing the first surface, wherein a plenum is defined by the first surface of the solid backing plate and the recessed portion defined by the second surface of the faceplate, and the plenum is fluidly coupled with the plurality of gas passages; and
 one or more magnetrons positioned along and coupled to the second surface of the solid backing plate.

10. The sputtering showerhead assembly of claim 9, wherein the target material is selected from the group consisting of nickel, chromium, aluminum, copper, tantalum, tantalum nitride, tantalum carbide, tungsten, tungsten nitride, titanium, an alloy thereof, and combinations thereof.

11. The sputtering showerhead assembly of claim 9, wherein the plurality of gas passages are evenly distributed across a surface area of the faceplate.

12. The sputtering showerhead assembly of claim 9, wherein the faceplate further comprises a cylindrical wall, which extends from a perimeter of the faceplate, perpendicular to the second surface of the faceplate, and further defines the recessed portion.

13. A method of deposition, comprising:
positioning a substrate on a substrate support in an interior volume of a deposition chamber, wherein the deposition chamber, comprises:
   a chamber body;
   a sputtering showerhead assembly, comprising:
      a faceplate comprising a solid body, the solid body having:
         a sputtering surface comprising a target material;
         a second surface opposing the sputtering surface; and
         a plurality of gas passages extending through the faceplate from the sputtering surface to the second surface of the faceplate, wherein the second surface of the faceplate defines a recessed portion;
      a solid backing plate positioned adjacent to the second surface of the faceplate and comprising:
         a first surface; and
         a second surface opposing the first surface, wherein a plenum is defined by the first surface of the solid backing plate and the recessed portion defined by the second surface of the faceplate, and the plenum is fluidly coupled with the plurality of gas passages; and
   one or more magnetrons positioned along and coupled to the second surface of the solid backing plate;
flowing a precursor fluid through the plurality of gas passages extending through the faceplate into the interior volume and depositing a first layer on the substrate, wherein the interior volume is disposed between the sputtering showerhead assembly and the substrate support; and
sputtering one or more metals from the sputtering surface of the faceplate to deposit a second layer on the first layer.

14. The method of claim 13, wherein the first layer is an oxide.

15. The method of claim 14, wherein the second layer is a metal-containing layer.

16. The method of claim 13, further comprising evacuating the interior volume after flowing the precursor fluid through the plurality of gas passages extending through the faceplate into the interior volume and prior to sputtering the one or more metals from the sputtering surface of the faceplate.

17. The method of claim 13, further comprising repeating flowing the precursor fluid through the plurality of gas passages extending through the faceplate into the interior volume and sputtering the one or more metals from the sputtering surface of the faceplate.

18. The method of claim 13, wherein the target material is selected from the group consisting of nickel, chromium, aluminum, copper, tantalum, tantalum nitride, tantalum carbide, tungsten, tungsten nitride, titanium, an alloy thereof, and combinations thereof.

19. The method of claim 16, wherein the plurality of gas passages are evenly distributed across a surface area of the faceplate.

20. The method of claim 13, wherein the faceplate further comprises a cylindrical wall, which extends from a perimeter of the faceplate, perpendicular to the second surface of the faceplate, and further defines the recessed portion.

\* \* \* \* \*